United States Patent
Mascherin

(10) Patent No.: US 11,867,740 B2
(45) Date of Patent: Jan. 9, 2024

(54) METHOD AND APPARATUS FOR IDENTIFYING A GRID FAULT

(71) Applicant: Bowman Power Group Limited, Southampton (GB)

(72) Inventor: Michela Mascherin, Southampton (GB)

(73) Assignee: Bowman Power Group Limited, Southampton (GB)

( * ) Notice: Subject to any disclaimer, the term of this patent is extended or adjusted under 35 U.S.C. 154(b) by 374 days.

(21) Appl. No.: 17/299,729

(22) PCT Filed: Dec. 19, 2019

(86) PCT No.: PCT/GB2019/053637
§ 371 (c)(1),
(2) Date: Jun. 3, 2021

(87) PCT Pub. No.: WO2020/128493
PCT Pub. Date: Jun. 25, 2020

(65) Prior Publication Data
US 2022/0018886 A1    Jan. 20, 2022

(30) Foreign Application Priority Data

Dec. 20, 2018 (GB) .................................... 1820803

(51) Int. Cl.
*G01R 31/08* (2020.01)
*H02J 13/00* (2006.01)
*H02J 3/00* (2006.01)
*G01R 19/165* (2006.01)

(52) U.S. Cl.
CPC ..... *G01R 31/086* (2013.01); *G01R 19/16547* (2013.01); *H02J 3/0012* (2020.01); *H02J 13/00002* (2020.01)

(58) Field of Classification Search
CPC ...................................................... G01R 31/00
See application file for complete search history.

(56) References Cited

U.S. PATENT DOCUMENTS

| | | | |
|---|---|---|---|
| 9,106,152 B2 | 8/2015 | De Brabandere et al. | |
| 9,478,968 B2 | 10/2016 | Blumschein et al. | |
| 2015/0177335 A1 | 6/2015 | Halt et al. | |
| 2016/0239010 A1* | 8/2016 | McDaniel | H02J 13/00002 |
| 2016/0370414 A1* | 12/2016 | Verneau | G01R 23/06 |

FOREIGN PATENT DOCUMENTS

| | | |
|---|---|---|
| CN | 103280826 A | 9/2013 |
| CN | 106597214 A | 4/2017 |
| CN | 107870285 A | 4/2018 |
| DE | 102011053237 A1 | 3/2012 |
| EP | 2591373 B1 | 6/2014 |
| GB | 2523552 A | 9/2015 |
| WO | 2015058769 A1 | 4/2015 |

OTHER PUBLICATIONS

Search Report under Section 17(5) dated Jun. 26, 2019 from counterpart GB Application No. 1820803.3, 5 pp.
International Search Report and Written Opinion dated Jun. 25, 2020 from counterpart International Application No. PCT/GB2019/053637, 11 pp.

* cited by examiner

*Primary Examiner* — Tung X Nguyen
(74) *Attorney, Agent, or Firm* — Shumaker & Sieffert, P.A.

(57) ABSTRACT

A method and apparatus for identifying a fault in an alternating current electrical grid is provided.

27 Claims, 2 Drawing Sheets

METHOD AND APPARATUS FOR IDENTIFYING A GRID FAULT

This application is a national stage application under 35 U.S.C. § 371 of PCT Application No. PCT/GB2019/053637, filed Dec. 19, 2019, which claims the benefit of Great Britain Application No. 1820803.3, filed Dec. 20, 2018. The entire contents of each of PCT Application No. PCT/GB2019/053637 and Great Britain Application No. 1820803.3 are incorporated herein by reference in their entireties.

TECHNICAL FIELD

The present disclosure relates to a method for identifying a fault in an alternating current electrical grid.

BACKGROUND

Alternating current electrical grids experience faults and disturbances, such as low voltage events and high voltage events. These faults or disturbances can cause electricity generation systems that are supplying power to an electrical grid or network to drop in performance and disconnect from the electrical grid or network. For example, a turbogenerator connected to a gas engine may stop producing power during a low voltage event, as the event may reduce the magnetic field produced by the electromagnets of the turbogenerator's stator. Alternatively, a grid fault or disturbance may impair the function of inverters supplying the grid with power.

Electrical grid or network operators often specify that any generation systems connected to an electrical grid or network comply with predetermined standards, these standards commonly referred to as distributed network operator (DNO) requirements. In many cases, one of the specified requirements is that the electricity generation system connected to the grid or network can remain connected and supplying power through faults or disturbances in the grid or network such as low voltage events. It is important that generation systems remain connected to the grid or network during these low voltage events to prevent the disconnection of a single generator from the grid from causing the disconnection of further generators in a chain reaction. As such, to prevent disconnection during any low voltage events, generation systems are designed to 'ride through' any low voltage events using fault ride through (FRT) or low voltage ride through (LVRT) procedures.

Current methods to detect and identify grid faults or disturbances are not quick enough to enable reliable fault ride through or low voltage ride through. For example, current methods of detecting grid faults frequently utilise methods of grid RMS voltage detection or peak detection which only identify a fault after half a period or one period of the waveform of the voltage of the alternating current grid. Additionally, methods which rely on the calculation of the voltage running average slow to detect and identify a grid fault or disturbance with the speed required for reliable fault ride through.

Objects and aspects of the present disclosure seek to alleviate these problems.

SUMMARY

According to a first aspect of the present disclosure there is provided a method for identifying a fault in an alternating current electrical grid, the method comprising: connecting to an alternating current electrical grid, the electrical grid having an instantaneous grid voltage, generating a reference sinusoidal waveform at a predetermined grid voltage and frequency, sampling the instantaneous grid voltage to determine a sampled voltage, and performing a first detection procedure, wherein the first detection procedure comprises: comparing the reference sinusoidal waveform to the sampled voltage to generate a comparison value, and determining a first grid condition from the comparison value.

In the context of this disclosure, connecting to an alternating current electrical grid comprises both connecting to the grid directly, such that the instantaneous voltage of the alternating current of the electrical grid can be directly sampled, and scenarios where this data is obtained indirectly form the grid. Furthermore, the sampled voltage is a value of the instantaneous voltage of the electrical grid, where the instantaneous voltage is the voltage of the electrical grid at a particular time point.

In the present disclosure, a fault is identified and detected by the method by comparing the sampled or measured voltage against a reference voltage. The reference voltage represents a reference, model, perfect or ideal voltage waveform for the present electrical grid or network conditions. Therefore, deviation of the sampled or measured voltage from the reference voltage indicates there may be a grid fault or disturbance in the electrical grid. This deviation is represented by the comparison value and is used to determine the first grid condition. For example, the grid condition can be set to be normal when there is no fault as the grid is operating close to its rated grid voltage, or the grid condition can be set to abnormal when a symmetric or asymmetric fault is detected. Detection and identification of a fault, such as a low voltage event, as represented by the first grid condition, can then be used to control electricity generation systems to prevent their disconnection from the grid.

The present method also generates a first grid condition quickly such that the method can comply with any DNO requirements. The speed of the detection method can be improved where the reference sinusoidal waveform is generated in advance and stored in a lookup table and recalled during the method. Alternatively, the method can generate the reference sinusoidal waveform in real-time whilst sampling the instantaneous grid voltage, as generating the waveform does not require complex and time-consuming calculations. Additionally, using the instantaneous grid voltage in the detection method increases the speed of fault detection by reducing lag.

Furthermore, the method is quick to identify an electrical fault as it focuses on the cause of electrical grid faults or disturbances, i.e. changes in voltage, rather than the consequence of the fault, i.e. changes in current.

Preferably, the step of comparing the reference sinusoidal waveform to the sampled voltage to generate a comparison value comprises calculating the difference in voltage between the reference sinusoidal waveform and the sampled voltage. In this way, a fault is identified by from the difference or deviation between the model voltage as represented by the reference sinusoidal waveform and actual voltage as represented by the sampled voltage.

Preferably, the step of comparing the reference sinusoidal waveform to the sampled voltage to generate a comparison value comprises calculating the relative difference between the reference sinusoidal waveform and the sampled voltage. For example, the relative difference can be calculated by dividing the difference between the reference sinusoidal waveform and sampled voltage by the reference sinusoidal waveform.

Comparing the relative difference or deviation has been found to improve fault detection and identification along the entirety of the waveform, as the relative difference helps factor in the sinusoidal nature of the voltage.

Alternatively, the comparison value can be any value measured or calculated from sampling or measuring the electrical grid.

Preferably, the step of comparing the reference sinusoidal waveform to the sampled voltage comprises calculating the difference in voltage between the reference sinusoidal waveform and the sampled voltage for each of the values of the sampled voltage.

Preferably, the step of comparing the reference sinusoidal waveform to the sampled voltage comprises calculating the difference in voltage between the reference sinusoidal waveform and the sampled voltage continuously. Continuously calculating the difference between the reference sinusoidal waveform and the sampled voltage helps to ensure that the method detects and identifies faults quickly.

Preferably, the step of generating a reference sinusoidal waveform at a predetermined grid voltage and frequency is performed continuously.

Preferably, the step of sampling the instantaneous grid voltage to determine the sampled voltage comprises sampling the electrical grid voltage at a frequency at least twice the maximum frequency of the electrical grid.

Preferably, the step of sampling the instantaneous grid voltage to determine the sampled voltage comprises sampling the electrical grid voltage at a frequency at least four times greater than the maximum frequency of the electrical grid.

Preferably, the step of sampling the instantaneous grid voltage to determine the sampled voltage comprises sampling the electrical grid voltage at a frequency of at least two orders of magnitude greater than the frequency of the electrical grid. Higher sampling rates improved identification of the voltage waveform and improves the fault detection procedure.

Preferably, the step of performing a first detection procedure is performed continuously.

Preferably, the step of comparing the reference sinusoidal waveform to the sampled voltage generate a comparison value is performed continuously.

Preferably, the step of determining a first grid condition from the comparison value comprises determining if the comparison value lies outside of a first parameter range.

Preferably, the first parameter range is predetermined. Preferably, the first parameter range is dynamic. Preferably, the first parameter range is calculated. Preferably, the first parameter range varies with time. Preferably, the first parameter range varies in concert with the frequency of the alternating current. Preferably, the first parameter range has an upper limit and a lower limit. Preferably, the upper limit and the lower limit may be the same value.

Preferably, the method comprises a further step of signalling a fault within the grid if the comparison value lies outside of the first parameter range. In other words, the method may comprise the step of determining the first grid condition to be a fault when the comparison value lies outside of the first parameter range.

Preferably, the method comprises a further step of signalling a fault within the grid if the comparison value is less than the lower limit first parameter range. Preferably, the method comprises a further step of signalling a fault within the grid if the comparison value is greater than the lower limit first parameter range.

Preferably, the method comprises a further step of signalling a fault within the grid to an energy generation system connected to the electrical grid if the comparison value lies outside of the first parameter range, where the upper and lower limits of the first parameter range are the overvoltage and undervoltage requirements of the energy generation system.

Preferably, the step of comparing the reference sinusoidal waveform to the sampled voltage to generate a comparison value comprises continuously generating a comparison value. Preferably, the step of determining a first grid condition from the continuously calculated comparison value comprises determining the length of time the continuously calculated comparison value lies outside of the first parameter range. The length of time which the sampled voltage deviates from the reference sinusoidal waveform can be used to distinguish between faults and normal fluctuations in the voltage of the electrical grid or network.

Preferably, the method comprises a further step of signalling a fault within the grid when the continuously calculated comparison value lies outside of the first parameter range for a time period longer than a first threshold time. The threshold time can be varied to affect the sensitivity of the detection method. The threshold time can be tuned to the needs of an energy generation system or electrical grid. For example, a shorter threshold time increases the sensitivity of the detection procedure, such that more faults will be detected. However, this shorter threshold time also increases the probability that these detections are false positives and within the normal fluctuations of the electrical grid.

Preferably, the step of comparing the reference sinusoidal waveform to the sampled voltage to generate a comparison value occurs only when a parameter of the reference sinusoidal waveform is above a threshold level. Preferably, the parameter of the reference sinusoidal waveform is the predicted voltage, and the threshold level is a value of the modulus of the predicted voltage. In each period the voltage of the reference sinusoidal waveform and instantaneous grid voltage are close to zero during their transition from positive to negative voltages. It has been found that comparison values generated close to this transition can be inaccurate or generate false positives in the identification of faults. As such, this preferred feature defines so-called dead bands for a range of voltages close to zero. The step of comparing the reference sinusoidal waveform to the sampled voltage to generate a comparison value is not performed during these dead bands for each of the phases of the voltage. The identification of dead bands has been found to improve the accuracy and reliability of fault detection.

Preferably, the method further comprises transmitting the comparison value or the first grid condition to a control system, where the control system controls an electricity generation system connected to the electrical grid. Preferably, the electricity generation system is a turbogenerator. Preferably, the control system is a power electronics system. Preferably, the power electronics system comprises an inverter.

Preferably, the method further comprises transmitting the comparison value or the first grid condition to a system connected to the grid.

Preferably, the method further comprises controlling a current output of the electricity generation system. Preferably, the step of controlling the current output comprises calculating a new current setpoint using the first grid condition and/or the comparison value. Preferably, the step of controlling the current output of the electricity generation system comprises setting the current output to the new current setpoint using a direct feed-forward control loop.

Preferably, the method further comprises the step of performing a second detection procedure.

Preferably, the second detection procedure comprises performing a direct-quadrature-zero transformation on the grid voltage measurement to determine a direct voltage value and an inverse voltage value. Preferably, the second detection procedure comprises determining a second grid condition from the direct voltage value and/or the inverse voltage value.

Including a second detection procedure has been found to be beneficial, as it can assist in identifying, detecting and confirming faults in a manner complementary to the first detection procedure. In particular, the generation of a second grid condition by the second detection procedure offers improved identification and detection of asymmetrical grid faults compared to the first detection method in isolation. In particular, the inverse voltage value is used to identify asymmetric faults, and the direct voltage value is used to detect symmetric faults.

Preferably, the step of determining a second grid condition from the direct voltage value comprises determining if the direct voltage value lies outside of a second parameter range. Preferably, the step of determining a second grid condition from the inverse voltage value comprises determining if the inverse voltage value lies outside of a third parameter range.

Preferably, the second parameter range is predetermined. Preferably, the second parameter range is dynamic. Preferably, the second parameter range is calculated. Preferably, the second parameter range varies with time. Preferably, the second parameter range varies in concert with the frequency of the alternating current. Preferably, the second parameter range has an upper limit and a lower limit. In some embodiments, the upper limit and the lower limit may be the same value.

Preferably, the third parameter range is predetermined. Preferably, the third parameter range is dynamic. Preferably, the third parameter range is calculated. Preferably, the third parameter range varies with time. Preferably, the third parameter range varies in concert with the frequency of the alternating current. Preferably, the third parameter range has an upper limit and a lower limit. In some embodiments, the upper limit and the lower limit may be the same value.

Preferably, the method comprises a further step of signalling a fault within the grid if the direct voltage value lies outside of the second parameter range. Preferably, the method comprises a further step of signalling a fault within the grid if the inverse voltage value lies outside of the third parameter range. In other words, the method may comprise the step of determining the second grid condition to be a grid fault when either the direct voltage value lies outside of the second parameter range or the inverse voltage value lies outside of the third parameter range.

Preferably, the method comprises a further step of signalling a fault within the grid to an energy generation system connected to the electrical grid if the direct voltage value lies outside of the second parameter range, where the upper and lower limits of the second parameter range represent the overvoltage, undervoltage or asymmetrical thresholds or requirements of the energy generation system. Preferably, the method comprises a further step of signalling a fault within the grid to an energy generation system connected to the electrical grid if the inverse voltage value lies outside of the third parameter range, where the upper and lower limits of the third parameter range represent asymmetrical thresholds or requirements of the energy generation system.

Preferably, the step of performing a direct-quadrature-zero transformation on the grid voltage measurement to determine a direct voltage value comprises continuously determining a direct voltage value. Preferably, the step of continuously determining a direct voltage value comprises making multiple measurements of the instantaneous grid voltage across a time period to obtain a number of grid voltage measurements, and subsequently performing a direct-quadrature-zero transformation on each of these grid voltage measurements to obtain a series of direct voltage values.

Preferably, the step of performing a direct-quadrature-zero transformation on the grid voltage measurement to determine an inverse voltage value comprises continuously determining an inverse voltage value. Preferably, the step of continuously determining an inverse voltage value comprises making multiple measurements of the instantaneous grid voltage across a time period to obtain a number of grid voltage measurements, and subsequently performing a direct-quadrature-zero transformation on each of these grid voltage measurements to obtain a series of inverse voltage values.

Preferably, the step of determining a second grid condition from the continuously calculated direct voltage value determining the length of time the continuously calculated direct voltage value lies outside of the second parameter range. Determining the length of time the direct voltage value lies outside of the second parameter range can be used to distinguish between faults and normal fluctuations in the voltage of the electrical grid or network. Furthermore, a fault detected using a direct voltage value can be identified as either symmetric or asymmetric.

Preferably, the step of determining a second grid condition from the continuously calculated inverse voltage value comprises determining the length of time the continuously calculated inverse voltage value lies outside of the third parameter range. Determining the length of time the inverse voltage value lies outside of third parameter range can be used to distinguish between faults and normal fluctuations in the alternating current of the electrical grid or network. Furthermore, a fault detected using an inverse voltage value can be identified as an asymmetric fault.

Preferably, the method comprises a further step of signalling a fault within the grid when the continuously calculated direct voltage value lies outside of the second parameter range for a time period longer than a second threshold time. The second threshold time can be varied to affect the sensitivity of the second detection method in a manner analogous to that described for the first detection method.

Preferably, the method comprises a further step of signalling a fault within the grid when the continuously calculated inverse voltage value lies outside of the third parameter range for a time period longer than a third threshold time. The third threshold time can be varied to affect the sensitivity of the second detection method in a manner analogous to that described above.

Preferably, the method further comprises transmitting the direct voltage value, the inverse voltage value or the second grid condition to a control system, where the control system controls an electricity generation system connected to the alternating current electrical grid. Preferably, the electricity generation system is a turbogenerator system. Preferably, the control system is a power electronics system. Preferably, the power electronics system comprises an inverter.

Preferably, the method further comprises transmitting the direct voltage value, inverse voltage value or the first grid condition to a system connected to the grid to identify grid faults with the grid.

Preferably, the method further comprises controlling a current output of the electricity generation system. Preferably, the step of controlling the current output of the electricity generation system comprises calculating a new current setpoint using the second grid condition, the direct voltage value and/or the inverse voltage value. Preferably, the step of controlling the current output of the electricity generation system comprises setting the current output to the new current setpoint using a direct feed-forward control loop.

Preferably, the step of performing the second detection procedure is continuously performed.

Preferably, the step of performing a direct-quadrature-zero transformation on the grid voltage measurement to determine a direct voltage value and an inverse voltage value is continuously performed.

Preferably, the step of determining a second grid condition from the direct voltage value and/or the inverse voltage value is continuously performed. Preferably, the step of determining a second grid condition from the direct voltage value and the inverse voltage value are performed simultaneously.

Preferably, the first detection procedure and the second detection procedure are performed simultaneously. By performing both detection procedures simultaneously, there are two different techniques being used to determine the identify faults. As such, the first and second detection procedures generate the first and second grid conditions simultaneously. Each detection method may be more sensitive to certain faults. For example, the first detection procedure may be quicker at detecting symmetric faults but fail to detect asymmetric faults that the second detection procedure identifies.

Preferably, the first grid condition is a symmetric fault and the second grid condition is an asymmetric fault.

Preferably, the first grid condition and the second grid condition are identical.

Preferably, the method further comprises transmitting at least two of the first grid condition, the comparison value, the second grid condition, the direct voltage value, or the inverse voltage value to a control system, where the control system controls an electricity generation system connected to the electrical grid. Preferably, the electricity generation system is a turbogenerator system. Preferably, the control system is a power electronics system. Preferably, the power electronics system comprises an inverter.

Preferably, the method further comprises controlling a current output of the electricity generation system. Preferably, the step of controlling the current output comprises calculating a new current setpoint using at least two of the first grid condition, the second grid condition, the direct voltage value, inverse voltage value or the comparison value. Preferably, the step of controlling the current output of the electricity generation system comprises setting the current output to the new current setpoint using a direct feed-forward control loop. Since a direct feed-forward control loop is used the output current responds more quickly the identification or detection of a grid fault.

According to a second aspect of the present disclosure there is provided a method for identifying a fault in an alternating current electrical grid, the method comprising connecting to an alternating current electrical grid, the electrical grid having an instantaneous grid voltage, sampling the instantaneous grid voltage to determine a grid voltage measurement and performing a detection procedure, wherein the detection procedure comprises: performing a direct-quadrature-zero transformation on the grid voltage measurement to determine a direct voltage value and an inverse voltage value, and determining a grid condition from the direct voltage value and the inverse voltage value. The grid voltage measurement is the instantaneous grid voltage at a specific time point.

Preferably, the step of determining a grid condition from the direct voltage value comprises determining if the direct voltage value lies outside of a second parameter range. Preferably, the step of determining a grid condition from the inverse voltage value comprises determining if the inverse voltage value lies outside of a third parameter range.

Preferably, the second parameter range is predetermined. Preferably, the second parameter range is dynamic. Preferably, the second parameter range is calculated. Preferably, the second parameter range varies with time. Preferably, the second parameter range varies in concert with the frequency of the alternating current.

Preferably, the third parameter range is predetermined. Preferably, the third parameter range is dynamic. Preferably, the third parameter range is calculated. Preferably, the third parameter range varies with time. Preferably, the third parameter range varies in concert with the frequency of the alternating current.

Preferably, the step of performing a direct-quadrature-zero transformation on the grid voltage measurement to determine a direct voltage value and an inverse voltage value comprises continuously determining a direct voltage value and continuously determining an inverse voltage value. Alternatively, the step of performing a direct-quadrature-zero transformation on the grid voltage measurement to determine a direct voltage value and an inverse voltage value comprises continuously determining a direct voltage values and continuously determining an inverse voltage values.

Preferably, the step of determining a grid condition from the continuously calculated direct voltage value comprises determining the length of time the continuously calculated direct voltage value lie outside of the second parameter range. Determining the length of time the direct voltage value lies outside of second parameter range can be used to distinguish between faults and normal fluctuations in the alternating current of the electrical grid or network. Furthermore, a fault detected using a direct voltage value can be identified as a symmetric fault and an asymmetric fault.

Preferably, the step of determining a grid condition from the continuously calculated inverse voltage value comprises determining the length of time the continuously calculated inverse voltage value lies outside of the third parameter range. Determining the length of time the inverse voltage value lies outside of third parameter range can be used to distinguish between faults and normal fluctuations in the voltage of the electrical grid or network. Furthermore, a fault detected using an inverse voltage value can be identified as an asymmetric fault.

Preferably, the method further comprises transmitting the direct voltage value, inverse voltage value or the second grid condition to a control system, where the control system controls an electricity generation system connected to the alternating current electrical grid. Preferably, the electricity generation system is a turbogenerator system. Preferably, the control system is a power electronics system. Preferably, the power electronics system comprises an inverter.

Preferably, the method further comprises controlling a current output of the electricity generation system. Preferably, the step of controlling the current output comprises calculating a new current setpoint using the direct voltage value, inverse voltage value and/or the second grid condition. Preferably, the step of controlling the current output of the electricity generation system comprises setting the current output to the new current setpoint using a direct feed-forward control loop.

According to a third aspect of the present disclosure, there is provided an apparatus configured to perform a method as described herein.

DETAILED DESCRIPTION

Embodiments of the present disclosure will now be described by way of example only and with reference to the accompanying drawings.

Figure 1:
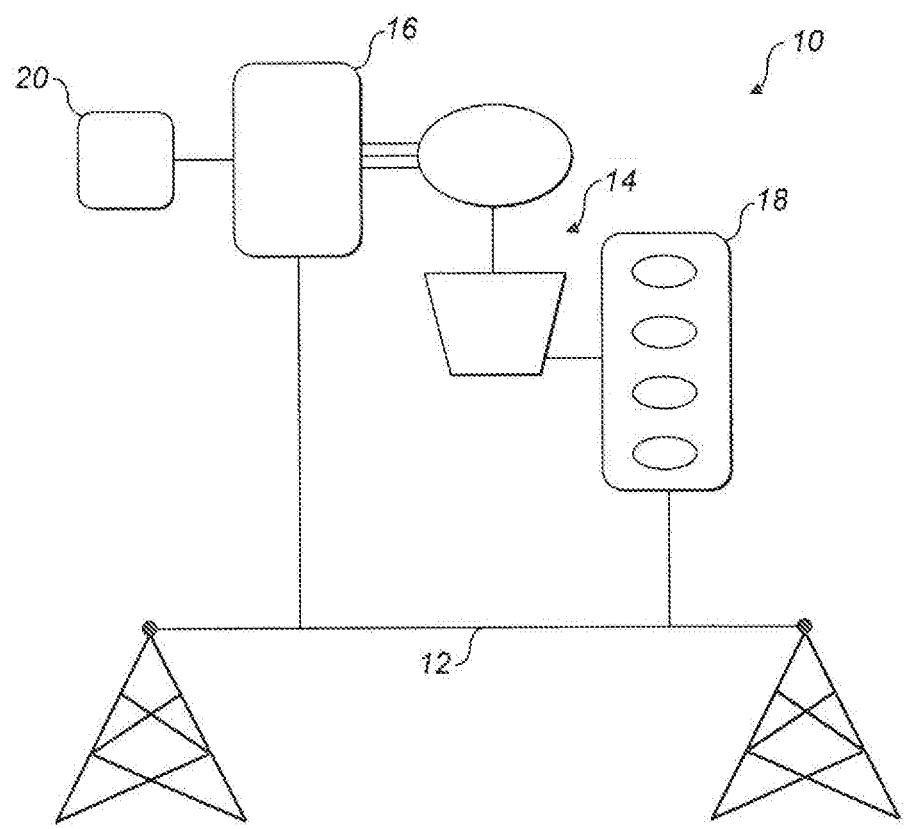
FIG. 1 is a schematic drawing of an apparatus for identifying a fault with an alternating current electrical grid in accordance with a third aspect of the present disclosure.

Referring to FIG. 1 there is depicted an apparatus 10 for the detection of a fault in an alternating current electrical grid 12 in accordance with a third aspect of the present disclosure. The electrical grid or network 12 is supplied with electrical power from a turbogenerator 14, where the power output of the turbogenerator 14 is supplied to the electrical grid 12 via a power electronics system 16. The turbogenerator 14 is fitted to the exhaust system of a gas engine 18, where the gas engine 18 also supplies electricity to the electrical grid 12. The power electronics system 16 comprises an inverter to convert the direct current power produced by the generator to the alternating current.

The apparatus 10 further comprises a control system 20, where the control system 20 is connected to the power electronics system 16 and the electrical grid 12. The control system 20 can control the current output of the turbogenerator 14 by controlling the current output of the power electronics system 16. Furthermore, in this embodiment, the connection between the control system 20 and the electrical grid 12 is via the power electronics system 16. The control system 20 receives real-time measurements of the current of the power electronics system 16 and voltage of the electrical grid 12 from the power electronics system. In other envisaged embodiments, the control system 20 is connected to the electrical grid 10 directly and performs its own measurements. Additionally, the control system 20 comprises a processor for performing calculations and a memory for storing data.

Figure 2:
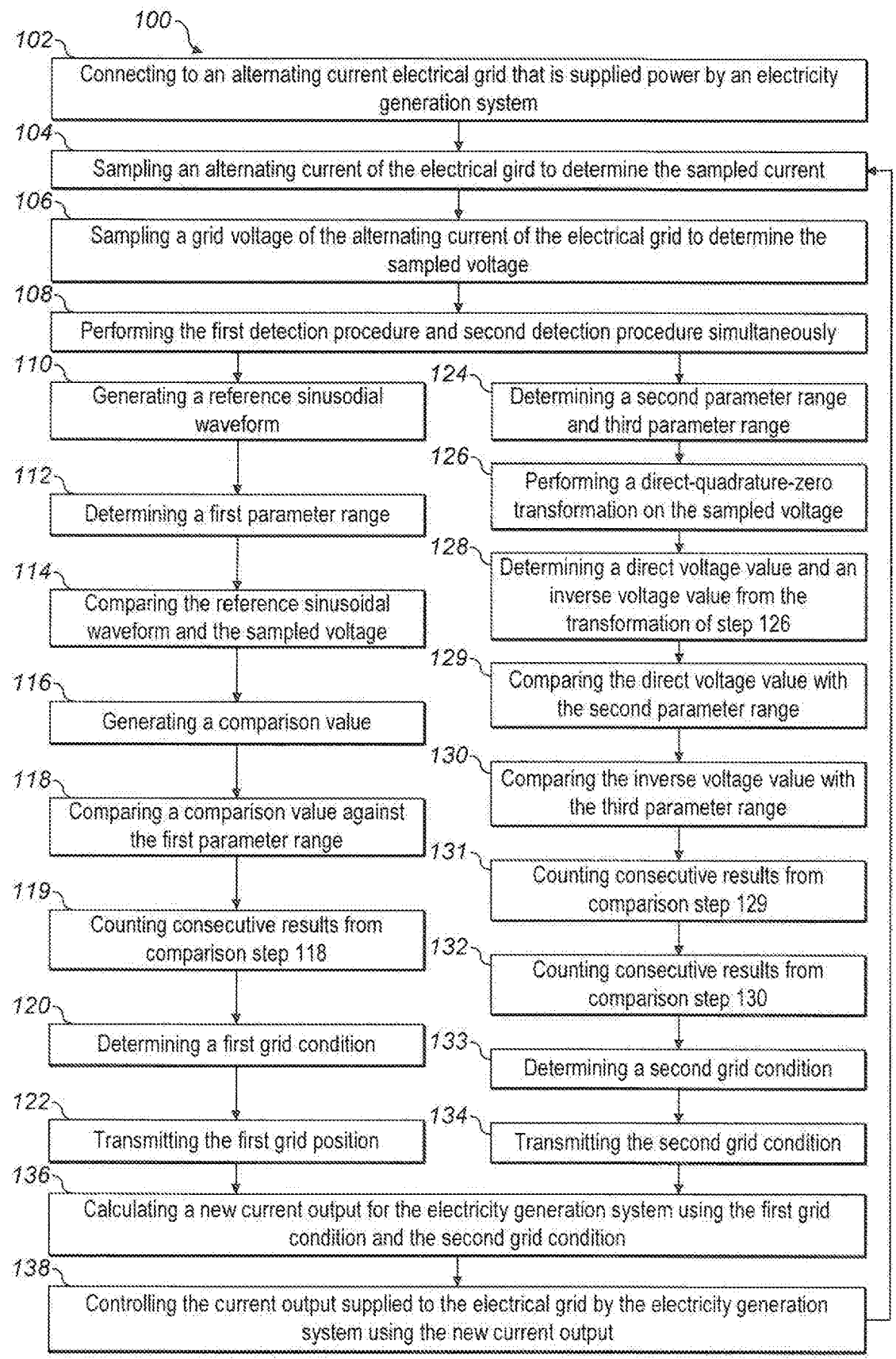
FIG. 2 is a flowchart of the method of identifying a fault in an alternating current electrical grid in accordance with the first aspect of the present disclosure.

Referring to FIG. 2 there is depicted a flow chart of the method 100 of identifying a fault in an alternating current electrical grid in accordance with a first aspect of the present disclosure.

The method 100 comprises an initial step 102 of connecting to an alternating current electrical grid that is supplied with electrical power by an electricity generation system. In the embodiment of FIG. 1, the electrical grid 12 is supplied power by the turbogenerator 14.

The alternating current of the electrical grid of step 102 is sampled or measured in the method step 104 to produce a sampled current of the electrical grid. This sampling of step 104 is performed continuously such that the current of the electrical grid at any particular moment can be determined. The power electronics system 16 transmits live data of the alternating current of the electrical grid 12 to the control system 20, where the processor of the control system 20 samples the alternating current to generate a sample current.

In step 106 the voltage of the electrical grid of step 102 is sampled and measured to determine the instantaneous grid voltage. The instantaneous grid voltage is used by the first detection procedure and the second detection procedure to identify and detect a fault in the electrical grid. The power electronics system 16 transmits live data of the instantaneous grid voltage of the electrical grid 12 to the control system 20, where the processor of the control system 20 samples the grid voltage to produce the sampled voltage.

Step 104 and step 106 are performed simultaneously such that the sampled current and the sampled grid voltage are sampled at the same time point.

In step 108, the first detection procedure and the second detection procedure are performed simultaneously and continuously on the continuously sampled voltage determined from the electrical grid of step 106. The first detection procedure is discussed first and the second detection procedure is discussed subsequently. Here, this is performed by the processor of the control system 20 and the sampled voltage of step 106, and the sample current of step 104 are stored in the memory of the control system 20.

In the first detection procedure, a reference sinusoidal waveform is generated in step 110. The reference sinusoidal waveform is generated in step 110 from a predetermined rated grid voltage and the nominal grid frequency and represents a model, ideal or perfect waveform of the voltage of the electrical grid. The reference sinusoidal waveform is generated by the processor of the control system 20 and stored in the memory of the control system 20. The reference sinusoidal waveform can be continually generated and updated to reflect the nominal conditions of the electric grid.

Step 112 of the first detection procedure comprises determining a first parameter range. The first parameter range represents the acceptable level of variation in a parameter. The first parameter range can be calculated continuously and can be dynamic by altering the variables used in its calculation. In the second embodiment, the first parameter range is a predetermined tolerated percentage difference in voltages of the electrical grid and the reference sinusoidal waveform which is stored in the memory of the control system 20.

In the second embodiment, step 110 and step 112 are performed simultaneously. Other embodiments are envisaged where these two steps are performed sequentially in either order.

Subsequent to these two steps is step 114. In step 114, the first detection procedure compares the reference sinusoidal waveform and the sampled voltage of step 106. This comparison aims to detect a fault in the electrical grid by detecting how the instantaneous voltage, i.e. the sampled voltage, deviates from the model, ideal or perfect scenario, i.e. the reference sinusoidal waveform.

The comparison of step 114 is performed by calculating the difference in the voltage between the reference sinusoidal waveform and the sampled voltage at a specified time point. The specified time point is set by the time at which the sampled voltage is determined from the electrical grid. The difference in voltage is calculated by subtracting the sampled voltage from the reference sinusoidal waveform. This calculation is performed by the processor of the control system 20 by recalling the values of the reference sinusoidal waveform and sampled voltage at a specific time point from the memory of the control system 20.

Subsequently, in step 116 the comparison of step 114 is converted to a comparison value. The difference between the reference sinusoidal and sampled voltage is divided by the reference sinusoidal waveform to yield the comparison value of step 116. The relative difference between the reference sinusoidal waveform and the sampled voltage, or their percentage voltage difference, at a specific time point is used as a comparison value of the first detection procedure. Relative differences are used as the comparison values as it helps improve fault detection at all voltages along the waveform.

Furthermore, in step 116 the comparison values are only generated at time points where the modulus of the voltage of the reference sinusoidal waveform exceeds a threshold voltage. If the modulus of the reference sinusoidal waveform is located below the threshold, the comparison value is not set and these time points are not analysed in the subsequent steps used to determine the grid condition. These times points are so-called dead bands. The presence of dead bands in the comparison between the reference sinusoidal waveform and the sampled voltage improves the reliability of first detection procedure by removing artefacts caused by dividing by the small voltages associated with the sinusoidal waveforms transitioning from positive to negative voltages.

Before a comparison value is calculated, the processor of the control system determines if the voltage of the reference sinusoidal waveform exceeds the threshold voltage. If not, the sampled voltage is located in a dead band and a comparison value is not calculated for use in the method. Conversely, if the reference sinusoidal waveform exceeds the threshold voltage the comparison value is calculated for this sampled voltage. The processed comparison value is stored in the memory of the control system 20.

Next, step 118 is performed. Step 118 compares the comparison value calculated in step 116 against the first parameter range determined in step 112. The aim of step 118 is to assess if the comparison value falls within the normal fluctuations or variations of instantaneous grid voltage expected and accepted by the regulators of an electrical grid.

Step 118 determines if the comparison value of step 116 lies outside of the first parameter range using the processor and memory of the control system 20. That is, the processor assesses if the comparison value is greater than or less than the first parameter range. Step 118 generates a TRUE result value if the comparison value is within the first parameter range and generates a FALSE result value if the comparison value lies outside of the first parameter range. In other embodiments, step 118 generates different result values if the comparison value is less than the lower limit of the first parameter range compared to if the comparison value is greater than the upper limit of the first parameter range.

The result value, i.e. TRUE or FALSE, from step 118 is supplied to step 119. Step 119 counts the number of consecutive results values of the same type. In other words, step 119 counts the number of consecutive TRUE values and step 119 counts the number of consecutive FALSE result values. From this count, step 119 generates a time value for the length of time that the voltage of the electrical grid is within its normal operating fluctuations from consecutive TRUE result values, or step 119 generates a time value for the length of time the voltage of the electrical grid is outside of its normal operating conditions from consecutive FALSE values. Consecutive FALSE result values indicate that a grid fault may be occurring within the electrical grid. Step 119 is continuously supplied with the TRUE or FALSE values from the comparison of step 118. In other words, step 119 receives a TRUE or FALSE value from step 118 for each sampled voltage of step 106. As such, step 119 is continuously counting the number of consecutive of the same result values. The count and length of the time are determined by the processor of the control system 20 and stored in the memory of the control system 20.

In step 120 the first grid condition of the electrical grid is determined using the count of consecutive TRUE or consecutive FALSE result values from step 119. The first grid condition of the electrical grid represents the condition, state or status of the electrical grid. For example, the first grid condition can be set to one of three values: FIRST FAULT, POTENTIAL FIRST FAULT or NORMAL. Step 120 is continuously supplied with the count of consecutive result values from step 119. In other words, step 120 receives a count of the consecutive result values from step 119 for each sampled voltage of step 106. As such, step 120 can continuously generate the first grid condition.

Step 120 determines the first grid condition by comparing a first threshold time against the period of time which the comparison value is outside of first parameter range as determined in step 119. That is, step 120 compares the length of time that consecutive FALSE result values have been determined by step 119 against the first threshold time. The comparison of step 120 is performed by the processor of the control system 20. The first threshold time is predetermined and set a time value that the grid operators recognise as a grid fault and is stored in the memory of the control system 20.

If the length of time of consecutive FALSE result values determined by step 119 exceeds the first threshold time, then the first grid condition is determined to be FIRST FAULT. If the length of time of consecutive FAULT values determined by step 119 is greater than zero and less than the first threshold time, then the first grid condition is determined to be POTENTIAL FIRST FAULT. Finally, if the length of time of consecutive FALSE result values is determined by step 119 is zero, then the first grid condition is determined to be FIRST NORMAL.

Subsequently in step 122, the value of the first grid condition is transmitted to a controller of an electricity generation system. In this embodiment, the controller is the control system 20. Furthermore, as step 120 is continuously generating a first grid condition, step 122 can continuously transmit the first grid condition to the control system 20. This is the final step of the first detection procedure.

As indicated in the discussion of step 108, the second detection procedure runs simultaneously with the first detection procedure and comprises the first step 124. In step, 124 a second parameter range and a third parameter range are determined. Similar to the first detection procedure, the second parameter range and the third parameter range represent acceptable levels of variation in their respective parameters before a grid fault is recognised. The second parameter range and third parameter range can be calculated continuously and can be dynamic by altering the variable used in their calculation. In the second embodiment, the second parameter range is a predetermined tolerated deviation in the direct voltage value of the instantaneous voltage of the electrical grid and is stored in the memory of the control system 20. The third parameter range is a predetermined tolerated deviation in the inverse voltage value of the instantaneous voltage of the electrical grid and is stored in the memory of the control system 20.

Step 126 performs a direct-quadrature-zero transformation on the sampled voltage of step 106. The method of performing this transformation will be readily apparent to the skilled addressee. Step 124 and step 126 can be performed simultaneously or sequentially in either order. This step is performed by the processor of the control system 20 on the sampled grid voltage of step 106.

From the transformation of step 126 the subsequent step, step 128, determines a direct voltage value and an inverse voltage value from the instantaneous voltage at a specified time as sampled in step 106.

Step 129 uses the direct voltage value from step 128. Step 129 comprises comparing the direct voltage value with the second parameter range and aims to determine if the direct voltage value falls within the normal fluctuations or variations expected in an electrical grid. In this embodiment, step 129 comprises determining if the direct voltage value lies outside of the second parameter range. Step 129 generates a TRUE second result value if the direct voltage is within the second parameter range and generates a FALSE second result value if the direct voltage value lies outside of the third parameter range.

Step 130 uses the inverse voltage value from step 128. Step 130 comprises comparing the inverse voltage value with the third parameter range and aims to determine if the inverse voltage value falls within the normal fluctuations or variations expected in an electrical grid. Step 130 comprises determining if the inverse voltage value lies outside of the third parameter range. Step 130 generates a TRUE third result value if the inverse voltage is within the third parameter range and generates a FALSE third result value if the inverse voltage value lies outside of the third parameter range.

Step 129 and step 130 are performed simultaneously on the same sampled voltage data using the processor and the values stored in the memory of the control system 20.

In other embodiments, step 129 and step 130 generate a different result values if the direct or inverse voltage values are less than the lower limit of the second or third parameter range, respectively, compared to if the direct or inverse voltage values are greater than the upper limit of the second or third parameter range, respectively.

The second result values, i.e. the TRUE or FALSE values from step 129, are used in step 131. Step 131 counts the number of consecutive results values of the same type. In other words, step 131 counts the number of consecutive TRUE second values and step 131 counts the number of consecutive FALSE second values. From this count, step 131 generates a value for the length of time that the direct voltage value of the electrical grid is within its normal operating fluctuations from consecutive TRUE second result values, or step 131 generates a value for the length of time the direct voltage value of the electrical grid is outside of its normal operating conditions from consecutive FALSE second result values. Consecutive FALSE second result values indicate that a symmetric grid fault may be occurring within the electrical grid. Step 131 continuously receives the TRUE or FALSE second result values from the comparison of step 129. In other words, step 131 receives a TRUE or FALSE value from step 129 for each sampled voltage of step 106. As such, step 131 is continuously counting the number of consecutive second result values of the same type. The count and length of the time are determined by the processor of the control system 20 and stored in the memory of the control system 20.

The third result values, i.e. TRUE or FALSE from step 130, are supplied to step 132. Step 132 counts the number of consecutive results values of the same type. In other words, step 132 counts the number of consecutive TRUE third values and step 132 counts the number of consecutive FALSE third values. From this count, step 132 generates a value for the length of time that the inverse voltage value of the electrical grid is within its normal operating fluctuations from consecutive TRUE third result values, or step 132 generates a value for the length of time the inverse voltage value of the electrical grid is outside of its normal operating conditions from consecutive FALSE third result values. Consecutive FALSE third result values indicate that an asymmetric grid fault may be occurring within the electrical grid. Step 132 is continuously supplied with the TRUE or FALSE third result values from the comparison of step 130. In other words, step 132 receives a TRUE or FALSE value from step 130 for each sampled voltage of step 106. As such, step 132 is continuously counting the number of consecutive third result values of the same type. The count and length of the time are determined by the processor of the control system 20 and stored in the memory of the control system 20.

Subsequently, in step 133 the second grid condition of the electrical grid is determined using the count of consecutive TRUE or FALSE second result values from step 131 and the count of consecutive TRUE or FALSE third result values from step 132. The second grid condition of the electrical grid represents the condition, state or status of the electrical grid. For example, the second grid condition can be set to one of three values: SECOND FAULT, SECOND FAULT, POTENTIAL SECOND FAULT or NORMAL. Step 133 is continuously supplied with the count of consecutive result values from step 131 and 132. In other words, step 133 receives a count of the consecutive result values from step 131 and step 132 for each sampled voltage of step 106. As such, step 133 can continuously generate the second grid condition.

Step 133 determines a second grid condition by comparing the length of time that consecutive FALSE second result values have been determined by step 131 against a second threshold time and by comparing the length of time that consecutive FALSE third result values have been determined by step 132 against a third threshold time. As such, the second grid condition is determined by the length of time the direct voltage value or the inverse voltage value lie outside of their respective parameter ranges. The comparison of step 120 comparison is performed by the processor of the control system 20.

The second threshold time and third threshold time are predetermined and set time values that the grid operators recognise as a grid fault. The second threshold time and the third threshold time are stored in the memory of the control system 20.

In step 133, if the length of time of consecutive FALSE second result values exceeds the second threshold time or if the length of time of consecutive FALSE third result values exceeds the third threshold time, then the second grid condition is determined to be SECOND FAULT. Furthermore, in step 133, if the length of time of consecutive FAULT second result values is greater than zero and less than the second threshold time or if the length of time of consecutive FAULT third result values is greater than zero and less than the third threshold time, then the second grid condition is determined to be POTENTIAL SECOND FAULT. Finally in step 133, if the length of time of consecutive FALSE second result values is zero and if the length of time of consecutive FALSE third result values is zero, then the second grid condition is determined to be SECOND NORMAL.

Step 133 is continuously receiving the length of time from steps 131 and 132 and, therefore, step 133 can continuously generate a second grid condition.

Subsequently in step 134, the value of the second grid condition is transmitted to a controller of an electricity generation system. In this embodiment, the second grid condition is transmitted to a control system 20 of the electricity generation system. Furthermore, as step 133 is continuously generating the second grid condition, step 134 can continuously transmit the second grid condition to the control system 20. This is the final step of the second detection procedure.

Next, step 136 receives the transmitted first grid condition from step 122 of the first detection procedure and the transmitted second grid condition from step 134 of the second detection procedure. Step 136 then uses these grid conditions to calculate a new current output of the electricity generation. The calculations of this step are performed using the memory and processor of the control system 20.

For example, step 136 could receive a first grid condition that is FIRST NORMAL and the second grid condition that is SECOND NORMAL. Step 136 will then calculate a new current output for the electricity generation system. In the present example, the new current output will not be changed from the present current output as no grid fault has been detected by either the first detection procedure or the second detection procedure.

In another example, step 136 receives a first grid condition that is POTENTIAL FIRST FAULT and a second grid condition that is SECOND NORMAL. In this example, step 136 will then calculate a new current output by factoring in that an asymmetric fault may be forming.

In a further example, step 136 receives a first grid condition that is FIRST FAULT and a second grid condition that is SECOND FAULT. In this example, step 136 will calculate a new current output factoring in that both the first detection procedure and the second detection procedure have detected a fault.

The current output of the electricity generation system is then controlled in step 138 to match the new current output calculated in previous step 136. Overall, the current output will be changed in line with the requirements or regulations of connecting to the alternating current electrical grid. The current output will be set to the current output calculated in the previous step using a direct feed-forward control loop. The direct feed-forward control loop occurs between the control system 20 and the power electronics system 16.

Step 138 then proceeds to step 104 such that the method can proceed in a continuous looped manner.

The invention claimed is:

1. A method comprising:
 connecting to an alternating current electrical grid, the alternating current electrical grid having an instantaneous grid voltage;
 generating a reference sinusoidal waveform at a predetermined grid voltage and frequency;
 sampling the instantaneous grid voltage to determine a sampled voltage; and
 performing a first detection procedure, wherein the first detection procedure comprises:
  comparing the reference sinusoidal waveform to the sampled voltage to generate a comparison value; and
  determining a first grid condition from the comparison value.

2. The method of claim 1, wherein comparing the reference sinusoidal waveform to the sampled voltage to generate the comparison value comprises calculating the difference in voltage between the reference sinusoidal waveform and the sampled voltage.

3. The method of claim 1, wherein comparing the reference sinusoidal waveform to the sampled voltage to generate the comparison value comprises calculating the relative difference between the reference sinusoidal waveform and the sampled voltage.

4. The method of claim 2, wherein comparing the reference sinusoidal waveform to the sampled voltage comprises continuously calculating the difference in voltage between the reference sinusoidal waveform and the sampled voltage.

5. The method of claim 1, wherein determining the first grid condition from the comparison value comprises determining if the comparison value lies outside of a first parameter range.

6. The method of claim 5, wherein the method further comprises signalling signaling a fault within the alternating current electrical grid if the comparison value lies outside of the first parameter range.

7. The method of claim 5, wherein comparing the reference sinusoidal waveform to the sampled voltage to generate the comparison value comprises continuously generating the comparison value, and further wherein determining a first grid condition from the comparison value comprises determining the length of time the comparison value lies outside of the first parameter range.

8. The method of claim 7, wherein the method further comprises signaling a fault within the alternating current electrical grid when the comparison value lies outside of the first parameter range for a time period longer than a first threshold time.

9. The method of claim 1, wherein comparing the reference sinusoidal waveform to the sampled voltage to generate the comparison value occurs only when a parameter of the reference sinusoidal waveform is above a threshold level.

10. The method of claim 9, wherein the parameter of the reference sinusoidal waveform is a predicted voltage, and the threshold level is a value of the modulus of the predicted voltage.

11. The method of claim 1, further comprising transmitting the comparison value or the first grid condition to a control system, where the control system controls a turbogenerator system connected to the alternating current electrical grid.

12. The method of claim 1, wherein the method further comprises performing a second detection procedure, wherein the second detection procedure comprises:
 performing a direct-quadrature-zero transformation on the grid voltage measurement to determine a direct voltage value and an inverse voltage value; and
 determining a second grid condition from the direct voltage value and the inverse voltage value.

13. The method of claim 12, wherein determining the second grid condition from the direct voltage value and the inverse voltage value comprises at least one of determining if the direct voltage value lies outside of a second parameter range or determining if the inverse voltage value lies outside of a third parameter range.

14. The method of claim 13, wherein performing the direct-quadrature-zero transformation on the grid voltage measurement to determine the direct voltage value comprises continuously determining a continuously calculated direct voltage value, and further wherein determining the second grid condition from the direct voltage value comprises determining the length of time the continuously calculated direct voltage value lies outside of the second parameter range.

15. The method of claim 14, further comprising signaling a fault within the grid when the continuously calculated direct voltage value lies outside of the second parameter range for a time period longer than a second threshold time.

16. The method of claim 13, wherein performing the direct-quadrature-zero transformation on the grid voltage measurement to determine the inverse voltage value comprises continuously determining a continuously calculated inverse voltage value, and further wherein determining the second grid condition from the inverse voltage value comprises determining the length of time the continuously calculated inverse voltage value lies outside of the third parameter range.

17. The method of claim 16, further comprising signaling a fault within the grid when the continuously calculated inverse voltage value lies outside of the third parameter range for a time period longer than a third threshold time.

18. The method of claim 13, further comprising signaling a fault within the grid if at least one of: the direct voltage value lies outside of the second parameter range or the inverse voltage value lies outside of the third parameter range.

19. The method of claim 12, further comprises further comprising transmitting the direct voltage value, the inverse voltage value or the second grid condition to a control system, where the control system controls a turbogenerator system connected to the alternating current electrical grid.

20. The method of claim 12, wherein the first detection procedure and the second detection procedure are performed simultaneously.

21. The method of claim 12, wherein the first grid condition and the second grid condition are identical.

22. A method for identifying a fault in an alternating current electrical grid, the method comprising:
   connecting to an alternating current electrical grid, the alternating current electrical grid having an instantaneous grid voltage;
   sampling the instantaneous grid voltage to determine a grid voltage measurement; and
   performing a detection procedure, wherein the detection procedure comprises:
      performing a direct-quadrature-zero transformation on the grid voltage measurement to determine a direct voltage value and an inverse voltage value, and
      determining a grid condition from the direct voltage value and the inverse voltage value.

23. The method of claim 22, wherein determining the grid condition from the direct voltage value and the inverse voltage value comprises at least one of determining if the direct voltage value lies outside of a second parameter range and/or or determining if the inverse voltage value lies outside of a third parameter range.

24. The method of claim 23, wherein performing the direct-quadrature-zero transformation on the grid voltage measurement to determine the direct voltage value comprises continuously determining a continuously calculated direct voltage value, and further wherein determining the grid condition from the direct voltage value comprises determining the length of time the continuously calculated direct voltage value lies outside of the second parameter range.

25. The method of claim 23, wherein performing the direct-quadrature-zero transformation on the grid voltage measurement to determine the inverse voltage value comprises continuously determining continuously calculated inverse voltage value, and further wherein determining the grid condition from the continuously calculated inverse voltage value comprises determining the length of time the continuously calculated inverse voltage value lies outside of the third parameter range.

26. The method of claim 20, further comprising:
   transmitting the direct voltage value, the inverse voltage value or the grid condition to a control system, where the control systems controls a turbogenerator system connected to the alternating current electrical grid.

27. An apparatus configured to perform the method of claim 22.

* * * * *